(12) United States Patent
Ogura et al.

(10) Patent No.: US 12,557,535 B2
(45) Date of Patent: Feb. 17, 2026

(54) DISPLAY DEVICE AND ELECTRONIC EQUIPMENT

(71) Applicant: Sony Semiconductor Solutions Corporation, Kanagawa (JP)

(72) Inventors: Masaya Ogura, Kanagawa (JP); Tomoyoshi Ichikawa, Kanagawa (JP); Takashi Sakairi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 381 days.

(21) Appl. No.: 18/034,582

(22) PCT Filed: Dec. 10, 2021

(86) PCT No.: PCT/JP2021/045574
§ 371 (c)(1),
(2) Date: Apr. 28, 2023

(87) PCT Pub. No.: WO2022/124401
PCT Pub. Date: Jun. 16, 2022

(65) Prior Publication Data
US 2024/0032401 A1 Jan. 25, 2024

(30) Foreign Application Priority Data
Dec. 11, 2020 (JP) .................. 2020-205503

(51) Int. Cl.
*H10K 59/80* (2023.01)
*H10K 59/35* (2023.01)
*H10K 59/12* (2023.01)

(52) U.S. Cl.
CPC ......... *H10K 59/879* (2023.02); *H10K 59/353* (2023.02); *H10K 59/878* (2023.02); *H10K 59/12* (2023.02); *H10K 59/876* (2023.02)

(58) Field of Classification Search
CPC .. H10K 59/879; H10K 59/353; H10K 59/878; H10K 59/12; H10K 59/876;
(Continued)

(56) References Cited

U.S. PATENT DOCUMENTS

| 9,595,693 B2* | 3/2017 | Murata | H10K 50/852 |
| 2014/0295597 A1* | 10/2014 | Sato | H10K 59/35 438/29 |

(Continued)

FOREIGN PATENT DOCUMENTS

| JP | 2006140130 A | 6/2006 |
| JP | 2007042535 A | 2/2007 |

(Continued)

OTHER PUBLICATIONS

International Search Report (PCT/ISA/210), International Application No. PCT/JP2021/045574, dated Feb. 8, 2022.

*Primary Examiner* — Mohammad M Hoque
(74) *Attorney, Agent, or Firm* — Michael Best & Friedrich LLP

(57) ABSTRACT

Display devices that prevent the generation of a step between subpixels are disclosed. In one example, a display device includes a substrate and subpixels of a plurality of colors two-dimensionally arranged on the substrate. Each of the subpixels includes a light-emitting element with a resonator structure, and the light-emitting element includes a reflective layer, an optical path length adjustment layer, a first electrode, an electroluminescent layer, and a second electrode in this order. The optical path length adjustment layer has a facing surface facing the electroluminescent layer, and the height of the facing surface is constant for each of the subpixels of the plurality of colors. The optical path length adjustment layer includes a plurality of refractive index layers with different refractive indexes, and the (Continued)

optical path length adjustment layer has a different layer configuration for each of the subpixels of the plurality of colors.

16 Claims, 11 Drawing Sheets

(58) Field of Classification Search
CPC .......... H10K 59/35; G09F 9/30; H05B 33/12; H05B 33/24
USPC .......................................................... 257/40
See application file for complete search history.

(56) References Cited

U.S. PATENT DOCUMENTS

| | | | | |
|---|---|---|---|---|
| 2021/0020868 A1* | 1/2021 | Ikeda | .................... | H10K 59/878 |
| 2021/0028238 A1* | 1/2021 | Koshihara | .............. | H10K 59/38 |

FOREIGN PATENT DOCUMENTS

| | | | | |
|---|---|---|---|---|
| JP | 2013165014 | A | * | 8/2013 |
| JP | 2014235959 | A | | 12/2014 |
| JP | 2015062194 | A | | 4/2015 |
| WO | 2019215530 | A1 | | 11/2019 |

* cited by examiner

A

B

C

D

E

A

B

DISPLAY DEVICE AND ELECTRONIC EQUIPMENT

TECHNICAL FIELD

The present disclosure relates to a display device and electronic equipment including the display device.

BACKGROUND ART

In recent years, organic electroluminescent (EL) display devices (hereinafter referred to simply as a "display device") have been spread widely. As this display device, a display device with a resonator structure (cavity structure) has been proposed (e.g., see Patent Document 1).

CITATION LIST

Patent Document

Patent Document 1: JP 2014-235959 A

SUMMARY OF THE INVENTION

Problems to be Solved by the Invention

However, in the display device with the resonator structure, the film thickness of an optical path length adjustment layer is different for each color subpixel, and hence a step is formed in an electrode, an organic EL layer, or the like between the subpixels, leading to a problem in that degradation of optical characteristics and reliability defects caused by the step are likely to occur.

An object of the present disclosure is to provide a display device capable of preventing the generation of a step between subpixels, and electronic equipment including the display device.

Solutions to Problems

In order to solve the above problem, a display device of a first disclosure includes:
a substrate; and
subpixels of a plurality of colors arranged two-dimensionally on the substrate.

Each of the subpixels includes a light-emitting element with a resonator structure, and the light-emitting element includes a reflective layer, an optical path length adjustment layer, a first electrode, an electroluminescent layer, and a second electrode in this order.

The optical path length adjustment layer has a facing surface facing the electroluminescent layer, and the height of the facing surface is constant for each of the subpixels of the plurality of colors.

The optical path length adjustment layer includes a plurality of refractive index layers with different refractive indexes.

The optical path length adjustment layer has a different layer configuration for each of the subpixels of the plurality of colors.

In the first disclosure, the "layer configuration" means, for example, the number of layers of the plurality of refractive index layers constituting the optical path length adjustment layer, the thicknesses of the plurality of refractive index layers constituting the optical path length adjustment layer, or both the number of layers and the thicknesses of the plurality of refractive index layers constituting the optical path length adjustment layer.

In the first disclosure, the subpixels of the plurality of colors may include a subpixel of a first color, a subpixel of a second color, and a subpixel of a third color. The plurality of colors may include a first color, a second color, and a third color. The first, second, and third colors may be red, green, and blue, respectively. The plurality of refractive index layers may include a first refractive index layer and a second refractive index layer.

A second disclosure is electronic equipment including the display device of the first disclosure.

MODE FOR CARRYING OUT THE INVENTION

Figure 1:
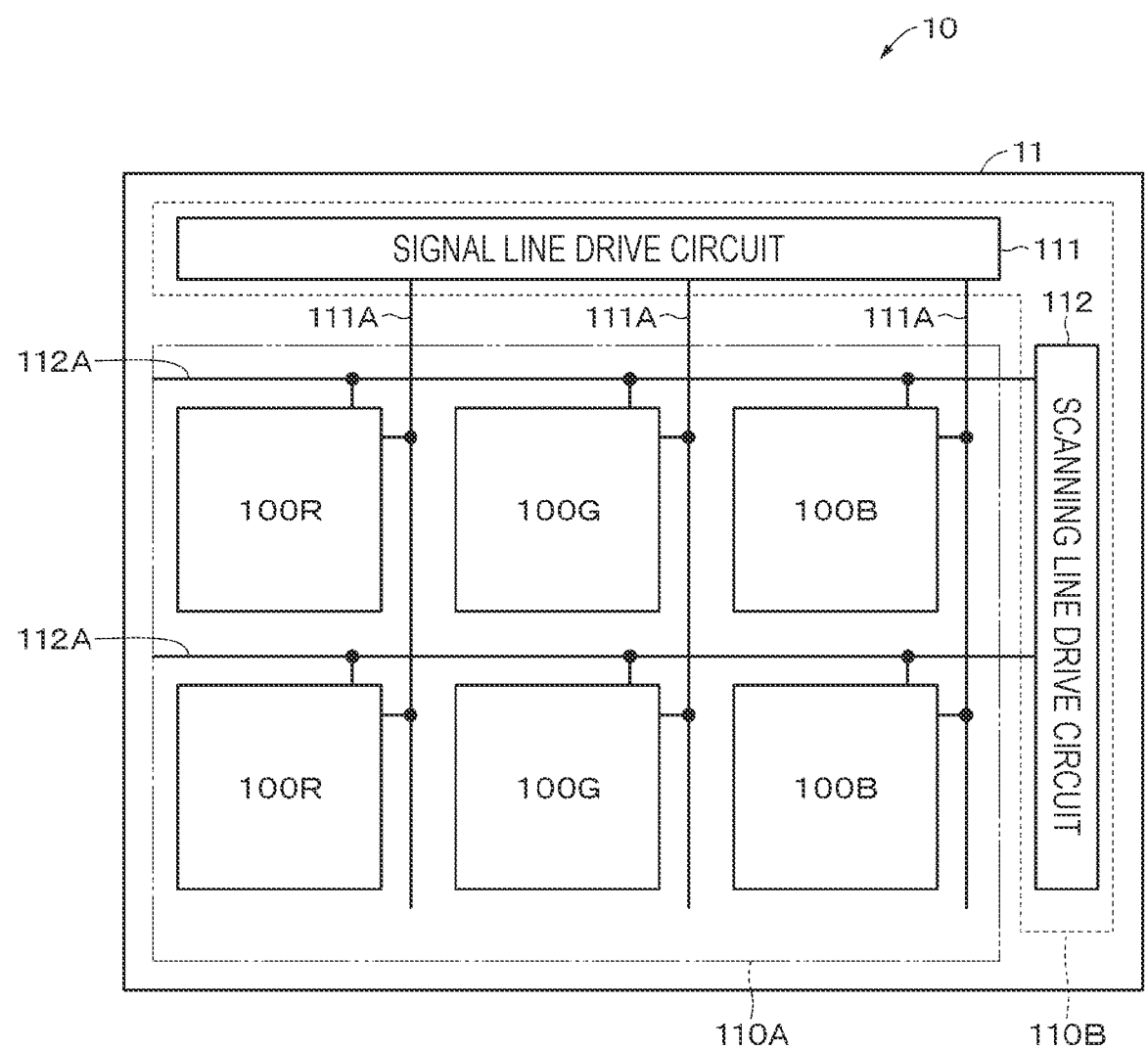
FIG. 1 is a schematic diagram illustrating an example of an overall configuration of a display device according to a first embodiment of the present disclosure.

Embodiments of the present disclosure will be described in the following order with reference to the drawings. Note that in all the drawings of the following embodiments, the same or corresponding parts are denoted by the same reference numerals.

1 First Embodiment (Example of display device)
2 Second Embodiment (Example of display device)
3 Modifications (Modifications of display device)

4 Application Examples (Examples of electronic equipment)

1 First Embodiment

[Configuration of Display Device]

FIG. 1 is a schematic diagram illustrating an example of an overall configuration of a display device 10 according to a first embodiment of the present disclosure. The display device 10 includes a display area 110A and a peripheral area 110B provided on the peripheral edge of the display area 110A. In the display area 110A, subpixels 100R, 100G, 100B of three colors are two-dimensionally arranged in a prescribed arrangement pattern such as a matrix.

The subpixel 100R is a red subpixel (a subpixel of a first color). The subpixel 100G is a green subpixel (a subpixel of a second color). The subpixel 100B is a blue subpixel (a subpixel of a third color). Note that in the following description, the subpixels 100R, 100G, 100B will be referred to as subpixels 100 unless otherwise distinguished. A combination of the adjacent subpixels 100R, 100G, 100B constitutes one pixel (pixel). FIG. 1 illustrates an example in which a combination of three subpixels 100R, 100G, 100B arranged in the row direction (horizontal direction) constitutes one pixel.

In the peripheral area 110B, a signal line drive circuit 111 and a scanning line drive circuit 112, which are drivers for video display, are provided. The signal line drive circuit 111 supplies the selected subpixel 100 with a signal voltage of a video signal corresponding to luminance information supplied from a signal supply source (not illustrated), through a signal line 111A. The scanning line drive circuit 112 includes a shift register or the like that sequentially shifts (transfers) a start pulse in synchronization with an input clock pulse. The scanning line drive circuit 112 scans the subpixels 100 row by row at the time of writing a video signal to each subpixel, and sequentially supplies a scanning signal to each scanning line 112A.

The display device 10 may be a micro-display. The display device 10 may be included in a virtual reality (VR) device, a mixed reality (MR) device, an augmented reality (AR) device, an electronic viewfinder (EVF), a small projector, or the like.

Figure 2:
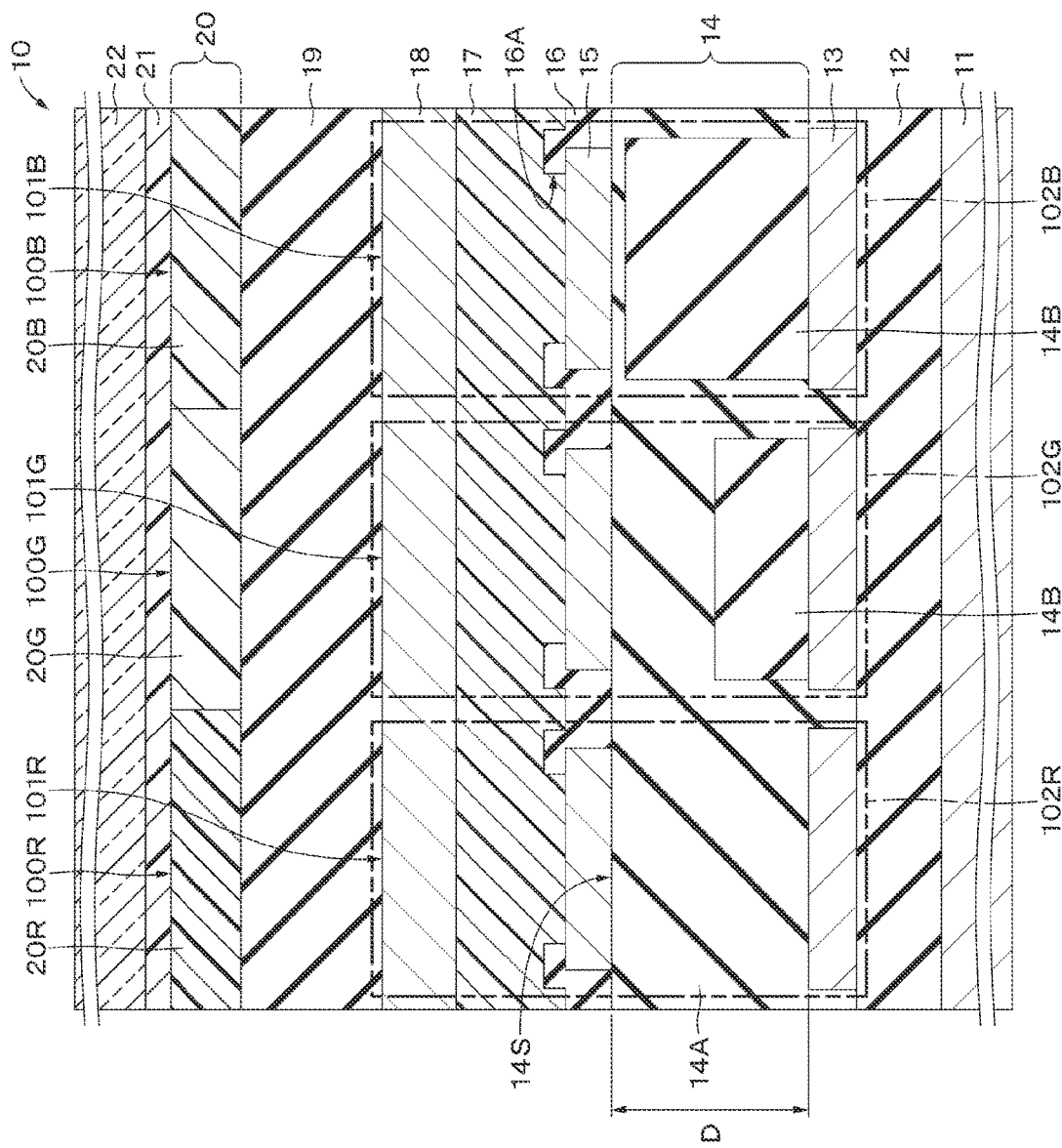
FIG. 2 is a cross-sectional view illustrating an example of the configuration of the display device according to the first embodiment of the present disclosure.

FIG. 2 is a cross-sectional view illustrating an example of the configuration of the display device 10 according to the first embodiment of the present disclosure. The display device 10 includes a drive substrate 11, an interlayer insulating layer 12, a reflective layer 13, an optical path length adjustment layer 14, a first electrode 15, an inter-element insulating layer 16, an organic electroluminescent layer 17 (hereinafter referred to as "EL layer 17"), a second electrode 18, a protective layer 19, a color filter 20, a filling resin layer 21, and a facing substrate 22. The drive substrate 11, the interlayer insulating layer 12, the reflective layer 13, the optical path length adjustment layer 14, the first electrode 15, the EL layer 17, the second electrode 18, the protective layer 19, the color filter 20, the filling resin layer 21, and the facing substrate 22 are laminated in this order. Note that the protective layer 19, the color filter 20, the filling resin layer 21, and the facing substrate 22 are provided as necessary, and at least one of these layers may not be provided.

The display device 10 is an example of a light-emitting device. The display device 10 is a top emission type display device. The facing substrate 22 side of the display device 10 is the top side, and the drive substrate 11 side of the display device 10 is the bottom side. In the following description, in each layer constituting the display device 10, a surface on the top side of the display device 10 is referred to as a first surface, and a surface on the bottom side of the display device 10 is referred to as a second surface.

(Light-Emitting Element)

The subpixels 100R, 100G, 100B include light-emitting elements 101R, 101G, 101B, respectively. Each of the light-emitting elements 101R, 101G, 101B includes the reflective layer 13, the optical path length adjustment layer 14, the first electrode 15, the EL layer 17, and the second electrode 18. The light-emitting elements 101R, 101G, 101B are so-called organic EL elements. The light-emitting elements 101R, 101G, 101B emit red light, green light, and blue light, respectively. In the following description, the light-emitting elements 101R, 101G, 101B will be referred to as light-emitting elements 101 when collectively referred to without being particularly distinguished.

(Resonator Structure)

The light-emitting elements 101R, 101G, 101B have resonator structures 102R, 102G, 102B, respectively. The resonator structures 102R, 102G, 102B include the reflective layer 13 and the second electrode 18. Each of the resonator structures 102R, 102G, 102B resonates, emphasizes, and emits light of a specified wavelength. Specifically, the resonator structure 102R resonates and emphasizes red light included in white light generated in the EL layer 17 and emits the red light to the outside. The resonator structure 102G resonates and emphasizes green light included in the white light generated in the EL layer 17 and emits the green light to the outside. The resonator structure 102B resonates and emphasizes the blue light included in the white light generated in the EL layer 17 and emits the blue light to the outside.

The distance between the reflective layer 13 and the second electrode 18 is set constant for each of the subpixels 100R, 100G, 100B of the three colors. On the other hand, the optical distance (optical path length) between the reflective layer 13 and the second electrode 18 is set in accordance with the light of the specified wavelength to be resonated. More specifically, in the resonator structure 102R, the optical path length between the reflective layer 13 and the second electrode 18 is set so that red light resonates. In the resonator structure 102G, the optical path length between the reflective layer 13 and the second electrode 18 is set so that green light resonates. In the resonator structure 102B, the optical path length between the reflective layer 13 and the second electrode 18 is set so that blue light resonates.

(Drive Substrate)

On the first surface of the drive substrate 11, the subpixels 100R, 100G, 100B of the three colors are two-dimensionally arranged in a prescribed arrangement pattern such as a matrix. The drive substrate 11 is a so-called backplane and drives the plurality of light-emitting elements 101. On the first surface of the drive substrate 11, a drive circuit that drives the plurality of light-emitting elements 101, a power supply circuit that supplies power to the plurality of light-emitting elements 101, and the like (all not illustrated) are provided.

The substrate body of the drive substrate 11 may include, for example, glass or resin with low moisture and oxygen permeability, or may include a semiconductor that facilitates the formation of a transistor or the like. Specifically, the substrate body may be a glass substrate, a semiconductor substrate, a resin substrate, or the like. The glass substrate includes, for example, high strain point glass, soda glass, borosilicate glass, forsterite, lead glass, quartz glass, and the like. The semiconductor substrate includes, for example, amorphous silicon, polycrystalline silicon, single-crystal silicon, and the like. The resin substrate contains, for example, at least one selected from the group consisting of polymethyl methacrylate, polyvinyl alcohol, polyvinyl phenol, polyether sulfone, polyimide, polycarbonate, polyethylene terephthalate, polyethylene naphthalate, and the like.

(Interlayer Insulating Film)

The interlayer insulating layer 12 (hereinafter referred to simply as an "insulating layer 12") is provided on the first surface of the drive substrate 11 and covers the drive circuit, the power supply circuit, and the like. The insulating layer 12 includes a plurality of contact plugs and a plurality of wires (both not illustrated). Each contact plug connects the reflective layer 13 and the drive circuit.

The insulating layer 12 may have a monolayer structure or a laminated structure. The insulating layer 12 may be an organic insulating layer, an inorganic insulating layer, or a laminate thereof. The organic insulating layer contains, for example, at least one selected from the group consisting of a polyimide-based resin, an acrylic resin, a novolac-based resin, and the like. The inorganic insulating layer contains, for example, at least one selected from the group consisting of silicon oxide ($SiO_2$), silicon nitride (SiN), silicon oxynitride (SiON), and the like.

(Reflective Layer)

The reflective layer 13 is provided on the first surface of the insulating layer 12. The reflective layer 13 is separated for each subpixel 100. The reflective layer 13 reflects light incident from the EL layer 17 through the first electrode 15 and the optical path length adjustment layer 14. The thickness of the reflective layer 13 is constant for each of the subpixels 100R, 100G, 100B.

The reflective layer 13 includes a material with light reflectivity. Specifically, the reflective layer 13 contains, for example, at least one metal element selected from the group consisting of silver (Ag), aluminum (Al), platinum (Pt), gold (Au), chromium (Cr), tungsten (W), and the like. The reflective layer 13 may contain at least one metal element described above as a constituent element of the alloy. Specific examples of the alloy include a silver alloy and an aluminum alloy.

An underlying layer (not illustrated) may be provided adjacent to the second surface side of the reflective layer 13. The underlying layer improves the crystal orientation of the reflective layer 13 during the film formation of the reflective layer 13. The underlying layer contains, for example, at least one selected from the group consisting of titanium (Ti), titanium nitride (TiN), titanium oxide ($TiO_2$), and the like.

(Optical Path Length Adjustment Layer)

The optical path length adjustment layer 14 is provided on the first surface of the insulating layer 12 and covers the reflective layer 13. The optical path length adjustment layer 14 is a layer for adjusting the optical path length between the reflective layer 13 and the second electrode 18 for each of the subpixels 100R, 100G, 100B of the three colors. The optical path length adjustment layer 14 has transparency. The optical path length adjustment layer 14 includes a plurality of contact plugs 14C (cf. FIG. 3). Each contact plug 14C connects the first electrode 15 and the reflective layer 13.

The optical path length adjustment layer 14 has a facing surface (first surface) 14S facing the EL layer 17, and the height of the facing surface 14S is constant for each of the subpixels 100R, 100G, 100B of the three colors. That is, the facing surface 14S of the optical path length adjustment layer 14 is flat in the display area 110A. A thickness D of the optical path length adjustment layer 14 between the reflective layer 13 and the first electrode 15 is constant for each of the subpixels 100R, 100G, 100B of the three colors.

The optical path length adjustment layer 14 has a different layer configuration for each of the subpixels 100R, 100G, 100B of the three colors. The layer configurations of the respective subpixels 100R, 100G, 100B of the three colors are set so that light beams corresponding to the respective colors of the subpixels 100R, 100G, 100B are resonated in the resonator structures 102R, 102G, 102B. That is, the layer configuration of the subpixel 100R is set so that red light corresponding to the color of the subpixel 100R is resonated in the resonator structure 102R. The layer configuration of the subpixel 100G is set so that green light corresponding to the color of the subpixel 100G is resonated in the resonator structure 102G. The layer configuration of the subpixel 100B is set so that blue light corresponding to the color of the subpixel 100B is resonated in the resonator structure 102B.

The optical path length adjustment layer 14 includes a first refractive index layer 14A and a second refractive index layer 14B. The first refractive index layer 14A and the second refractive index layer 14B have different refractive indexes. Specifically, the refractive index of the second refractive index layer 14B is higher than the refractive index of the first refractive index layer 14A. The layer configuration of the optical path length adjustment layer 14 in at least one subpixel (specifically, the subpixels 100G, 100B) among the subpixels 100R, 100G, 100B of the three colors is a lamination configuration of the first refractive index layer 14A and the second refractive index layer 14B.

Specifically, the layer configuration of the optical path length adjustment layer 14 in the subpixel 100R is a monolayer configuration of the first refractive index layer 14A. The layer configuration of the optical path length adjustment layer 14 in each of the subpixel 100G and the subpixel 100B is a lamination configuration of the first refractive index layer 14A and the second refractive index layer 14B. In each of the subpixel 100G and the subpixel 100B, the second refractive index layer 14B and the first refractive index layer 14A are laminated on the reflective layer 13 in this order. The thicknesses of the first refractive index layer 14A and the second refractive index layer 14B are different between the subpixel 100G and the subpixel 100B. The thickness of the first refractive index layer 14A in the subpixel 100G is larger than the thickness of the first refractive index layer 14A in the subpixel 100B. On the other hand, the thickness of the second refractive index layer 14B in the subpixel 100G is smaller than the thickness of the second refractive index layer 14B in the subpixel 100B.

The first refractive index layer 14A is continuously provided over the subpixels 100R, 100G, 100B of the three colors. On the other hand, the second refractive index layer 14B is separated into islands, and the respective separated second refractive index layers 14B are provided in the subpixels 100G, 100B, respectively, among the subpixels 100R, 100G, 100B of the three colors. The first refractive index layer 14A is provided on the first surface of the insulating layer 12 so as to cover each of the separated second refractive index layers 14B. The side surface of each of the separated second electrodes is covered with the first refractive index layer 14A. This enables the total reflection of light at the interface between the side surface of the second refractive index layer 14B and the first refractive index layer 14A covering the side surface. Therefore, the front luminance of display device 10 can be improved.

The first refractive index layer 14A includes, for example, a metal oxide. The metal oxide contained in the first refractive index layer 14A includes, for example, at least one selected from the group consisting of silicon oxide ($SiO_2$), silicon oxynitride (SiON), and aluminum oxide (AlO).

The second refractive index layer 14B includes, for example, a metal oxide. The metal oxide contained in the second refractive index layer 14B includes at least one selected from the group consisting of silicon oxynitride (SiON), silicon nitride (SiN), niobium oxide (NbO), and titanium oxide ($TiO_2$).

(First Electrode)

Figure 3:
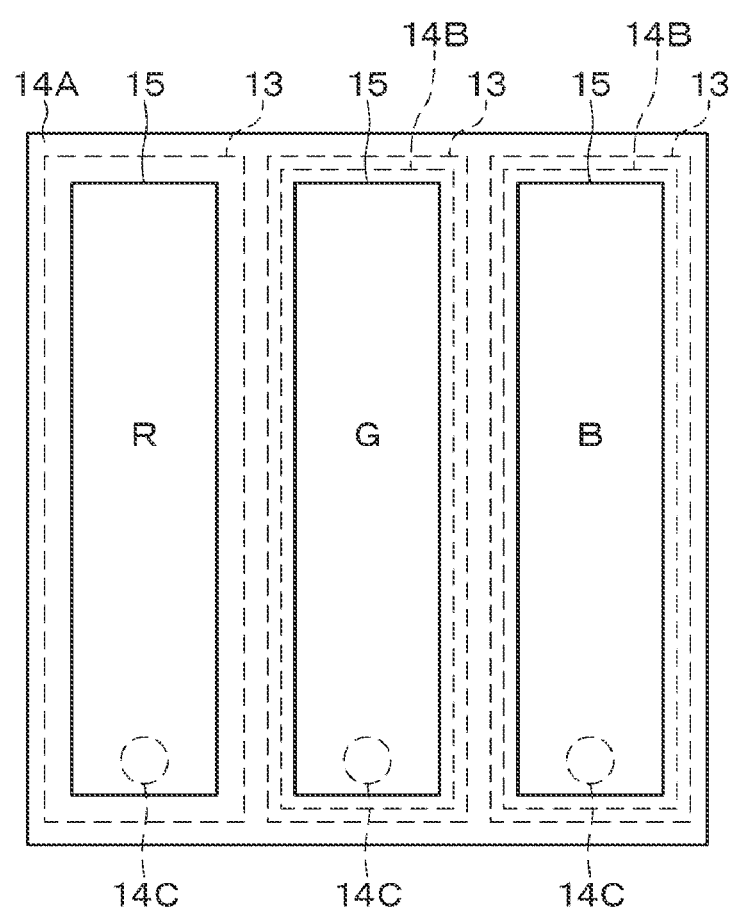
FIG. 3 is a plan view illustrating an example of a configuration of a reflective layer, an optical path length adjustment layer, and a first electrode.

The first electrode 15 is provided on the first surface of the optical path length adjustment layer 14. The first electrode 15 is separated for each subpixel 100. The first electrode 15 is an anode. When a voltage is applied between the first electrode 15 and the second electrode 18, holes are injected from the first electrode 15 into the EL layer 17. As illustrated in FIG. 3, the first electrode 15 is connected to the contact plug 14C.

From the viewpoint of enhancing the light emission efficiency, the first electrode 15 preferably includes a material with a high work function and a high transmittance. The first electrode 15 is preferably a transparent electrode. The transparent electrode includes, for example, a transparent conductive oxide (TCO). The transparent conductive oxide contains, for example, at least one selected from the group consisting of a transparent conductive oxide containing indium (hereinafter referred to as "indium-based transparent conductive oxide"), a transparent conductive oxide containing tin (hereinafter referred to as a "tin-based transparent conductive oxide"), and a transparent conductive oxide containing zinc (hereinafter referred to as a "zinc-based transparent conductive oxide").

The indium-based transparent conductive oxide includes, for example, indium tin oxide (ITO), indium zinc oxide (IZO), indium gallium oxide (IGO), indium gallium zinc oxide (IGZO), or fluorine-doped indium oxide (IFO). Among these transparent conductive oxides, indium tin oxide (ITO) is particularly preferable. This is because indium tin oxide (ITO) has a particularly low barrier for hole injection into the EL layer 17 in terms of a work function and can thus make the drive voltage of the display device 10 particularly low. The tin-based transparent conductive oxide contains, for example, tin oxide, antimony-doped tin oxide (ATO), or fluorine-doped tin oxide (FTO). The zinc-based transparent conductive oxide includes, for example, zinc oxide, aluminum-doped zinc oxide (AZO), boron-doped zinc oxide, or gallium-doped zinc oxide (GZO).

(Second Electrode)

The second electrode 18 is provided on the first surface of the EL layer 17. The second electrode 18 faces the first electrode 15. The second electrode 18 is continuously provided over all the subpixels 100 in the display area 110A and is provided as an electrode common to all the subpixels 100 in the display area 110A. The second electrode 18 is a cathode. The second electrode 18 is a transparent electrode having transparency for light generated in the EL layer 17. Here, the transparent electrode also includes a semi-transmissive reflecting layer. From the viewpoint of enhancing the light emission efficiency, the second electrode 18 preferably includes a material with a low work function.

The second electrode 18 includes, for example, at least one of a metal layer or a metal oxide layer. More specifically, the second electrode 18 includes a monolayer film of a metal layer or a metal oxide layer, or a laminated film of a metal layer and a metal oxide layer. In a case where the second electrode 18 includes a laminated film, the metal layer may be provided on the EL layer 17 side, or the metal oxide layer may be provided on the EL layer 17 side. However, from the viewpoint of making the layer with a low work function adjacent to the EL layer 17, the metal layer is preferably provided on the EL layer 17 side.

The metal layer contains, for example, at least one metal element selected from the group consisting of magnesium (Mg), aluminum (Al), silver (Ag), calcium (Ca), sodium (Na), and the like. The metal layer may contain at least one metal element described above as a constituent element of the alloy. Specific examples of the alloy include an MgAg alloy, an MgAl alloy, and an AlLi alloy. The metal oxide contains, for example, at least one of a mixture of indium oxide and tin oxide (ITO), a mixture of indium oxide and zinc oxide (IZO), or zinc oxide (ZnO).

The second electrode 18 may be a multilayer film in which a first metal layer and a second metal layer are laminated. The first metal layer of the first metal layer and the second metal layer may be provided on the EL layer 17 side. The first metal layer contains, for example, at least one selected from the group consisting of calcium (Ca), barium (Ba), lithium (Li), cesium (Cs), indium (In), magnesium (Mg), and silver (Ag). The first metal layer may contain at least one metal element described above as a constituent element of the alloy. The second metal layer contains, for example, at least one selected from the group consisting of magnesium (Mg) and silver (Ag). The second metal layer may contain at least one metal element described above as a constituent element of the alloy.

(EL Layer)

The EL layer 17 is provided between the first electrode 15 and the second electrode 18. The EL layer 17 is continuously provided over all the subpixels 100 in the display area 110A and is provided as an organic layer common to all the subpixels 100 in the display area 110A.

The EL layer 17 is configured to be able to emit white light. The EL layer 17 may be an organic EL layer with a one-stack structure, an organic EL layer with a two-stack structure, or any other organic EL layer. The organic EL layer with a one-stack structure has a configuration in which, for example, a hole injection layer, a hole transport layer, a red light-emitting layer, a light emission separation layer, a blue light-emitting layer, a green light-emitting layer, an electron transport layer, and an electron injection layer are laminated in this order from the first electrode 15 toward the second electrode 18. The organic EL layer with a two-stack structure has, for example, a configuration in which a hole injection layer, a hole transport layer, a blue light-emitting layer, an electron transport layer, a charge generation layer, a hole transport layer, a yellow light-emitting layer, an electron transport layer, and an electron injection layer are laminated in this order from the first electrode 15 toward the second electrode 18.

The hole injection layer is for enhancing the hole injection efficiency into each light-emitting layer and preventing leakage. The hole transport layer is for enhancing the hole transport efficiency to each light-emitting layer. The electron injection layer is for enhancing the electron injection efficiency into each light-emitting layer. The electron transport layer is for enhancing the electron transport efficiency to each light-emitting layer. The light emission separation layer is a layer for adjusting injection of carriers into each light-emitting layer, and the light emission balance of each color is adjusted by injecting electrons or holes into each light-emitting layer through the light emission separation layer. The charge generation layer supplies electrons and holes to two light-emitting layers, which sandwich the charge generation layer, respectively.

The red light-emitting layer, the green light-emitting layer, the blue light-emitting layer, and the yellow light-emitting layer generate red light, green light, blue light, and yellow light, respectively, by application of an electric field, causing recombination between holes injected from the first electrode 15 and electrons injected from the second electrode 18.

(Inter-Element Insulating Layer)

The inter-element insulating layer 16 (hereinafter referred to as an "insulating layer 16") is provided above the first surface of the optical path length adjustment layer 14 and between the adjacent first electrodes 15. The insulating layer 16 insulates the separated first electrodes 15 from each other. The insulating layer 16 has a plurality of openings 16A. The plurality of openings 16A is provided corresponding to the respective subpixels 100, respectively. More specifically, the plurality of openings 16A is provided on the first surfaces (the surfaces facing the second electrode 18) of the respective separated first electrodes 15, respectively. The first electrode 15 and the EL layer 17 are in contact with each other through the opening 16A.

As a constituent material of the insulating layer 16, a material similar to that of the insulating layer 12 described above can be exemplified.

(Protective Layer)

The protective layer 19 is provided on the first surface of the second electrode 18 and covers the plurality of light-emitting elements 101. The protective layer 19 shields the light-emitting element 101 from the outside air and prevents moisture infiltration into the light-emitting element 101 from the external environment. Further, in a case where the second electrode 18 includes a metal layer, the protective layer 19 may have a function of preventing the oxidation of the metal layer.

The protective layer 19 includes, for example, an inorganic material with low hygroscopicity. The inorganic material includes, for example, at least one of silicon oxide ($SiO_2$), silicon nitride (SiN), silicon oxynitride (SiNO), titanium oxide (TiO), or aluminum oxide (AlO). The protective layer 19 may have a monolayer structure, but may have a multilayer structure in the case of increasing the thickness of the protective layer 19. This is to relieve the internal stress in the protective layer 19. The protective layer 19 may include a polymer resin. The polymer resin contains at least one selected from the group consisting of a thermosetting resin, an ultraviolet curable resin, and the like.

(Color Filter)

The color filter 20 is provided on the first surface of the protective layer 19. The color filter 20 is, for example, an on-chip color filter (OCCF). The color filter 20 includes, for example, a red filter 20R, a green filter 20G, and a blue filter 20B. The red filter 20R, the green filter 20G, and the blue filter 20B are provided to face the light-emitting elements 101R, 101G, 101B, respectively. The red filter 20R and the light-emitting element 101R constitute a subpixel 100R, the green filter 20G and the light-emitting element 101G constitute a subpixel 100G, and the blue filter 20B and the light-emitting element 101B constitute a subpixel 100B.

Red light, green light, and blue light emitted from the light-emitting element 101R, the light-emitting element 101G, and the light-emitting element 101B pass through the red filter 20R, the green filter 20G, and the blue filter 20B described above, respectively. Thus, red light, green light, and blue light with high color purity are emitted from the display surface. Further, a light shielding layer (not illustrated) may be provided in an area between the filters 20R, 20G, 20B of the respective colors, that is, between the subpixels 100 of the color filter 20. Note that the color filter 20 is not limited to the on-chip color filter but may be a filter provided on the second surface of the facing substrate 22.

(Filling Resin Layer)

The filling resin layer 21 is provided between the color filter 20 and the facing substrate 22. The filling resin layer 21 has a function as an adhesive layer for bonding the color filter 20 and the facing substrate 22. The filling resin layer 21 contains, for example, at least one selected from the group consisting of a thermosetting resin, an ultraviolet curable resin, and the like.

(Facing Substrate)

The facing substrate 22 is provided to face the drive substrate 11. More specifically, the facing substrate 22 is provided such that the second surface of the facing substrate 22 and the first surface of the drive substrate 11 face each other. The facing substrate 22 seals the light-emitting element 101, the color filter 20, and the like. The facing substrate 22 includes a material such as glass transparent to each color light emitted from the color filter 20.

[Method for Manufacturing Display Device]

Hereinafter, an example of a method for manufacturing the display device 10 according to the first embodiment of the present disclosure will be described with reference to FIGS. 4A to 4E and FIGS. 5A to 5E.

Figure 4:
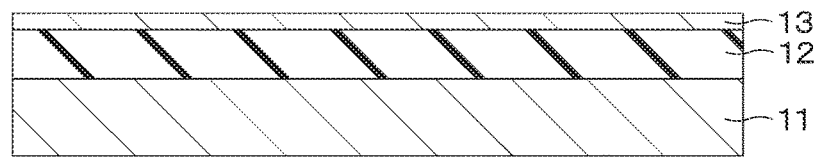
FIGS. 4A, 4B, 4C, 4D, and 4E are cross-sectional views for explaining an example of a method for manufacturing the display device according to the first embodiment of the present disclosure.
Figure 4:
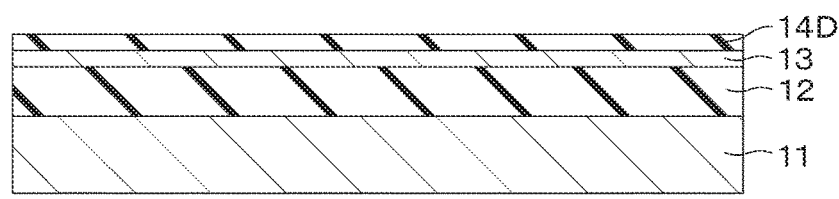
Figure 4:
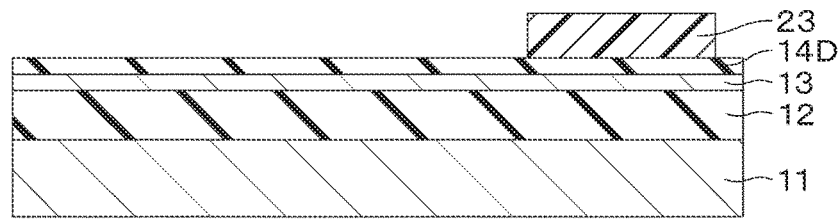
Figure 4:
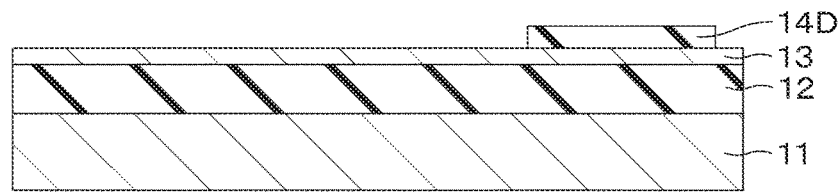
Figure 4:
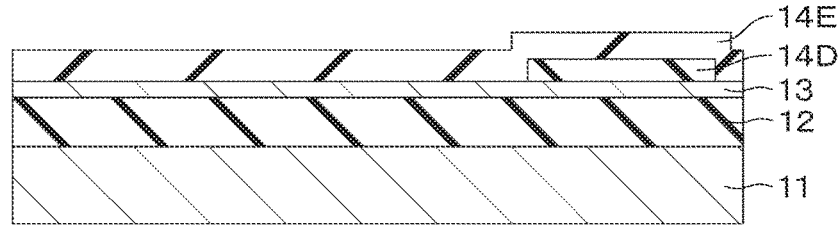

First, a drive circuit, a power supply circuit, and the like are formed on the first surface of the substrate body using, for example, thin film forming technology, photolithography technology, and etching technology. As a result, the drive substrate 11 is obtained. Next, the insulating layer 12 is formed on the first surface of the drive substrate 11 so as to cover the drive circuit, the power supply circuit, and the like by, for example, chemical vapor deposition (CVD). Next, as illustrated in FIG. 4A, the reflective layer 13 is formed on the first surface of the insulating layer 12 by, for example, sputtering. Next, the reflective layer 13 is patterned using, for example, photolithography technology and etching technology, and the subpixels 100 are separated at corresponding portions. Note that in FIG. 4B and the subsequent drawings, the separation portion of the reflective layer 13 is omitted.

Next, as illustrated in FIG. 4B, a metal oxide layer 14D is formed on the first surface of the reflective layer 13 by, for example, CVD. Next, as illustrated in FIG. 4C, a resist mask having a predetermined pattern is formed on the first surface of the metal oxide layer 14D, and then the metal oxide layer 14D is dry-etched through the resist mask. Thereby, as illustrated in FIG. 4D, the metal oxide layer 14D remains in the area corresponding to each subpixel 100B.

Figure 5:
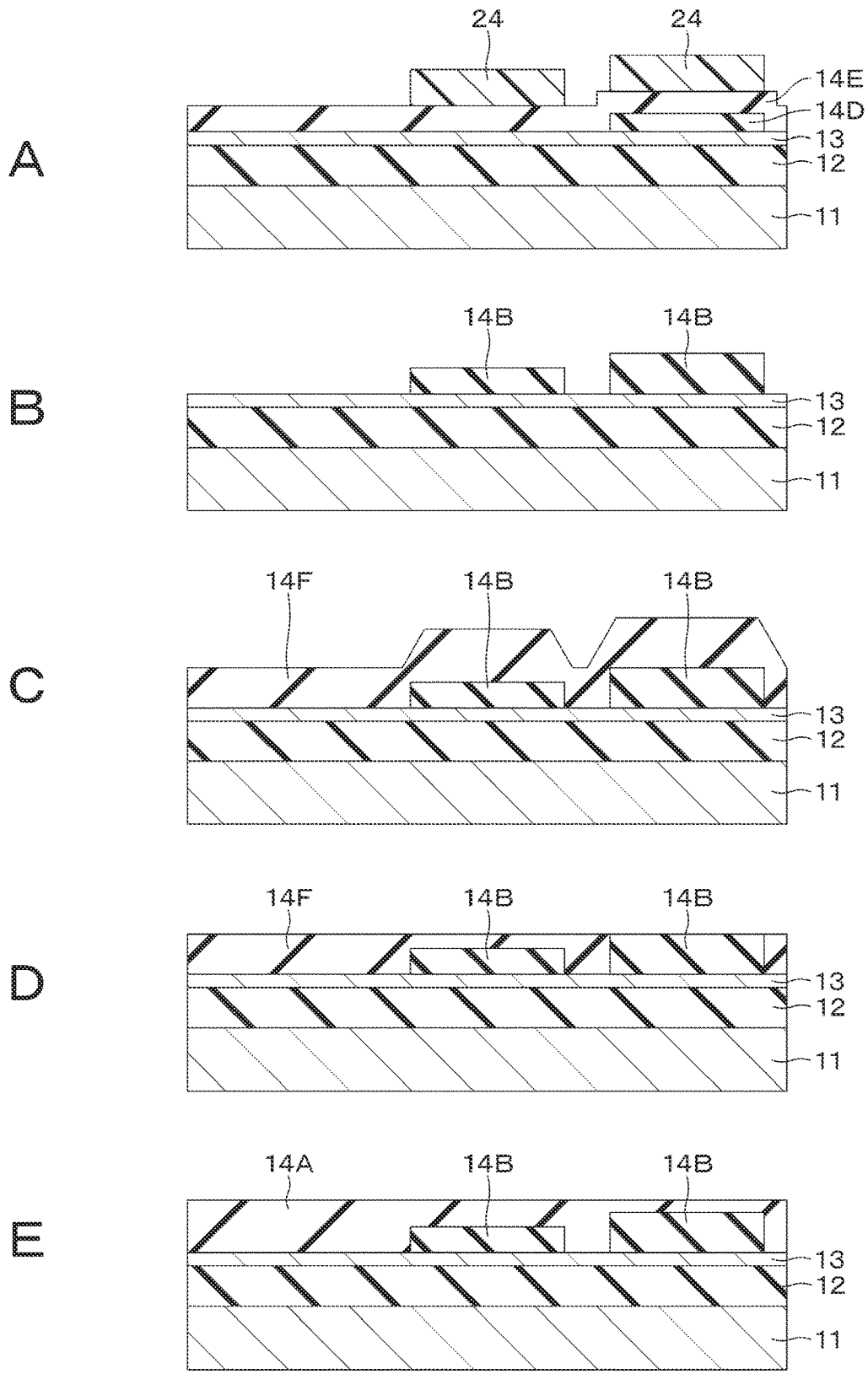
FIGS. 5A, 5B, 5C, 5D, and 5E are cross-sectional views for explaining an example of a method for manufacturing the display device according to the first embodiment of the present disclosure.

Next, as illustrated in FIG. 4E, a metal oxide layer 14E is formed on the first surface of the reflective layer 13 by, for example, CVD, and covers the metal oxide layer 14D. Next, as illustrated in FIG. 5A, a resist mask having a predetermined pattern is formed on the first surface of the metal oxide layer 14E, and then the metal oxide layer 14D is dry-etched through the resist mask. Thereby, as illustrated in FIG. 5B, the metal oxide layer 14E remains in an island shape in the area corresponding to each subpixel 100G and the area corresponding to each subpixel 100B, and the second refractive index layer 14B having two types of heights is formed.

Next, as illustrated in FIG. 5C, a metal oxide layer 14F is formed on the first surface of the reflective layer 13 by, for example, CVD, and covers the island-shaped second refractive index layer 14B. Next, the first surface of the metal oxide layer 14F is polished by, for example, chemical mechanical polishing (CMP) to expose the first surface of the higher second refractive index layer 14B of the second refractive index layers 14B having two types of heights as illustrated in FIG. 5D. Next, the first surface of the metal oxide layer 14F from which the second refractive index layer 14B is exposed is subjected to plasma treatment to change the state of the first surface of the second refractive index layer 14B. Thereby, as illustrated in FIG. 5E, the first refractive index layer 14A is formed so as to cover the second refractive index layer 14B having two types of heights. That is, the optical path length adjustment layer 14 is formed on the first surface of the reflective layer 13.

Next, the metal oxide layer is sequentially formed on the first surface of the insulating layer 12 by, for example, sputtering, and then the metal oxide layer is patterned using, for example, photolithography technology and etching technology. Thus, the first electrode 15 separated for each subpixel 100 is formed.

Next, the insulating layer 16 is formed on the first surface of the optical path length adjustment layer 14 so as to cover the first electrode 15 by, for example, plasma CVD. Next, an opening 16A is formed at a position corresponding to each subpixel 100 by, for example, photolithography technology and dry etching technology. Thereby, the first surfaces of the separated first electrodes 15 are exposed.

Next, the hole injection layer, the hole transport layer, the red light-emitting layer, the light emission separation layer, the blue light-emitting layer, the green light-emitting layer, the electron transport layer, and the electron injection layer are laminated in this order on the first surface of the first electrode 15 and the first surface of the optical path length adjustment layer 14 by, for example, vapor deposition to form the EL layer 17. Next, the second electrode 18 is formed on the first surface of the EL layer 17 by, for example, vapor deposition or sputtering. Thus, the plurality of light-emitting elements 101 is formed on the first surface of the insulating layer 12.

Next, the protective layer 19 is formed on the first surface of the second electrode 18 by, for example, CVD or vapor deposition, and then the color filter 20 is formed on the first surface of the protective layer 19 by, for example, photolithography. Note that in order to flatten a step in the protective layer 19 or a step caused by the difference in the film thickness of the color filter 20 itself, a flattening layer may be formed on or under, or both on and under, the color filter 20. Next, the color filter 20 is covered with the filling resin layer 21 using, for example, one-drop filling (ODF), and then the facing substrate 22 is placed on the filling resin layer 21. Next, for example, heat is applied to the filling resin layer 21, or the filling resin layer 21 is irradiated with ultraviolet rays to cure the filling resin layer 21, thereby bonding the drive substrate 11 and the facing substrate 22 through the filling resin layer 21. As a result, the display device 10 is sealed. As described above, the display device 10 illustrated in FIG. 2 is obtained.

[Action Effects]

As described above, in the display device 10 according to the first embodiment, the optical path length adjustment layer 14 has the facing surface 14S facing the EL layer 17, and the height of the facing surface 14S is constant for each of the subpixels 100R, 100G, 100B of the three colors, so that it is possible to prevent the generation of a step in the insulating layer 16, the EL layer 17, the second electrode 18, or the like between the subpixels 100R, 100G, 100B. Therefore, it is possible to prevent the degradation of optical characteristics and reliability defects caused by the step described above.

2 Second Embodiment

[Configuration of Display Device]

Figure 6:
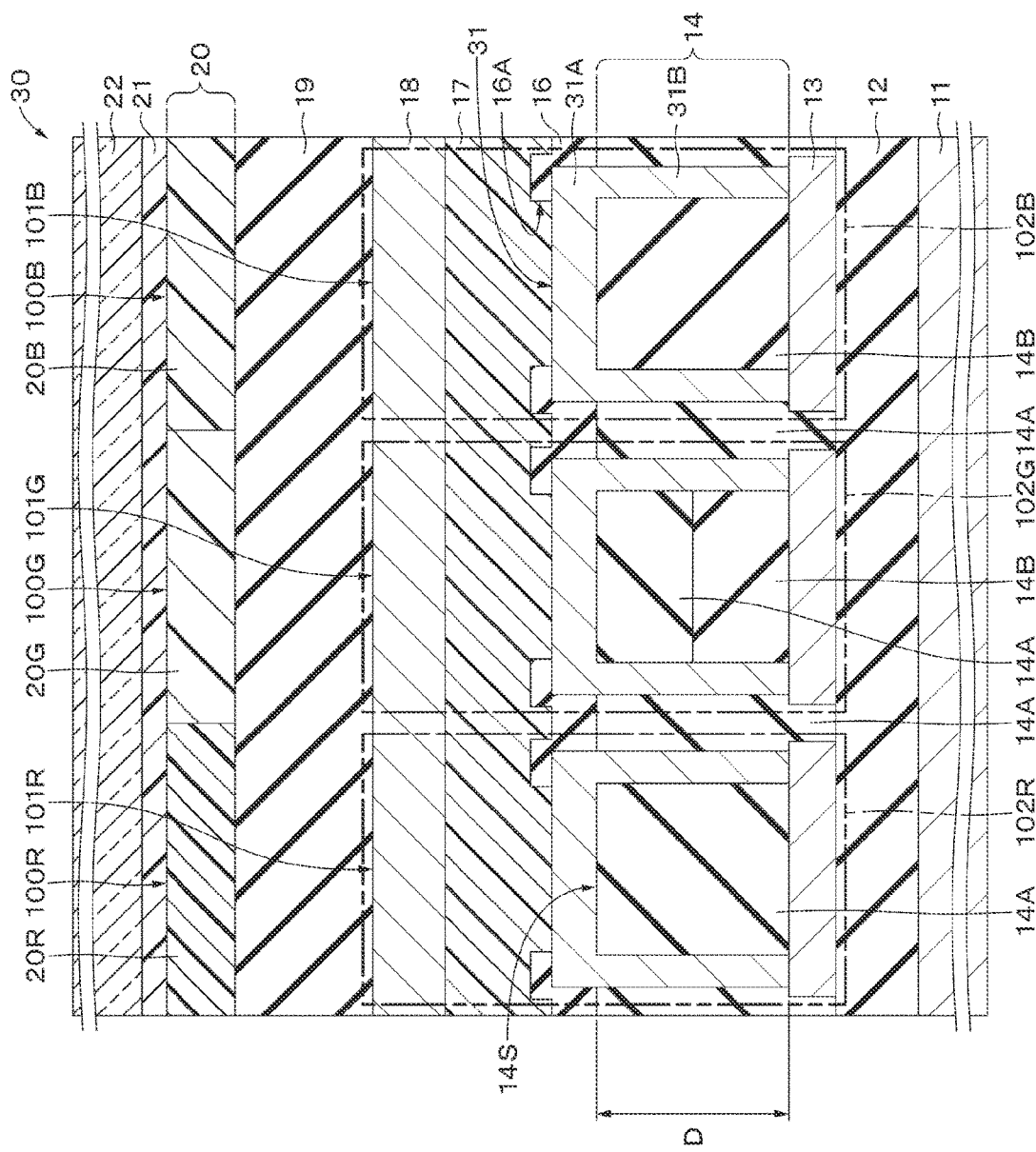
FIG. 6 is a cross-sectional view illustrating an example of a configuration of a display device according to a second embodiment of the present disclosure.
Figure 7:
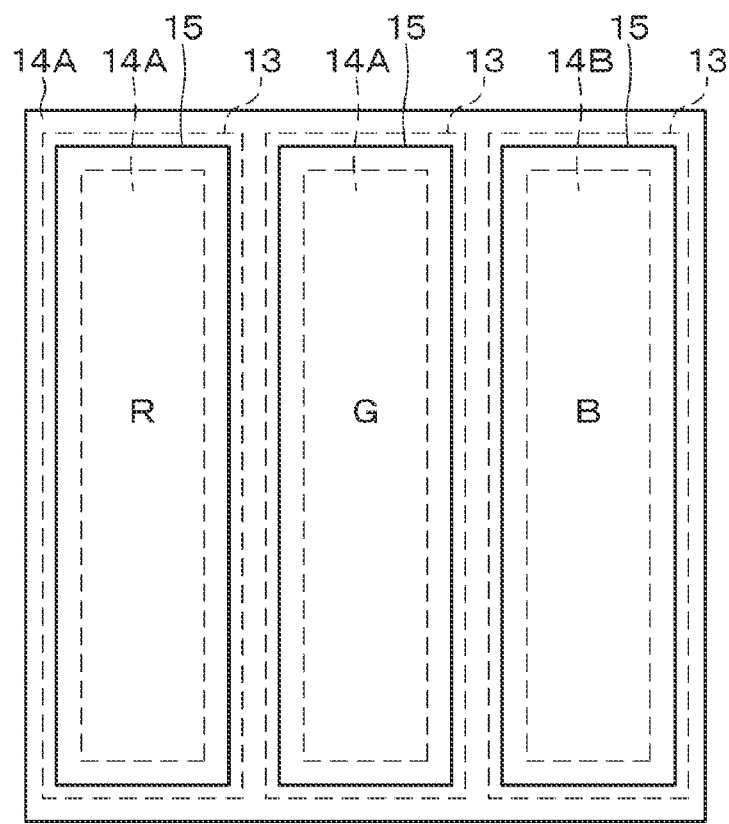
FIG. 7 is a plan view illustrating an example of a configuration of a reflective layer, an optical path length adjustment layer, and a first electrode.

FIG. 6 is a cross-sectional view illustrating an example of a configuration of a display device 30 according to a second embodiment of the present disclosure. FIG. 7 is a plan view illustrating an example of the configuration of the reflective layer 13, the optical path length adjustment layer 14, and the first electrode 31. The display device 30 is different from the display device 10 according to the first embodiment in that a first electrode 31 is provided instead of the first electrode 15 and that the layer configuration of the optical path length adjustment layer 14 in the subpixel 100B is the monolayer configuration of the second refractive index layer 14B. Note that in the second embodiment, the same reference numerals are given to similar parts as those of the first embodiment, and the description thereof will be omitted.

The first electrode 31 includes an electrode body 31A and an extended portion 31B. The electrode body 31A has a similar configuration to that of the first electrode 15 in the first embodiment. The extended portion 31B is extended from the entire peripheral edge of the second surface of the electrode body 31A toward the peripheral edge of the first surface of the reflective layer 13, and the tip of the extended portion 31B is connected to the peripheral edge of the first surface of the reflective layer 13. Thus, the extended portion 31B forms a peripheral wall surrounding the first surface of the reflective layer 13. Here, the second surface of the electrode body 31A is a facing surface facing the first surface of the reflective layer 13, and the first surface of the reflective layer 13 is a facing surface facing the second surface of the electrode body 31A.

In the subpixel 100R, the first refractive index layer 14A is provided between the electrode body 31A and the reflective layer 13. In the subpixel 100G, the first refractive index layer 14A and the second refractive index layer 14B are provided between the electrode body 31A and the reflective layer 13. FIG. 6 illustrates an example in which the reflective layer 13, the second refractive index layer 14B, the first refractive index layer 14A, and the electrode body 31A are laminated in this order in the subpixel 100R. However, the reflective layer 13, the first refractive index layer 14A, the second refractive index layer 14B, and the electrode body 31A may be laminated in this order in the subpixel 100G. In the subpixel 100B, the second refractive index layer 14B is provided between the electrode body 31A and the reflective layer 13.

In the second embodiment, the thickness D of the optical path length adjustment layer 14 between the reflective layer 13 and the electrode body 31A is set constant for each of the subpixels 100R, 100G, 100B of the three colors.

[Action Effects]

As described above, in the display device 30 according to the second embodiment, the first electrode 31 includes the electrode body 31A and the extended portion 31B, and the extended portion 31B is extended from the peripheral edge of the second surface of the electrode body 31A toward the peripheral edge of the first surface of the reflective layer 13 and is connected to the peripheral edge of the first surface of the reflective layer 13. This makes it possible to improve the aperture ratio as compared with the configuration in which the first electrode 15 and the reflective layer 13 are connected by the contact plug 14C (cf. FIG. 3). Note that in the case of the connection configuration illustrated in FIG. 3, one end of the first electrode 15 connected to the contact plug 14C is covered with the insulating layer 16 and is thus an area not contributing to light emission.

With the extended portion 31B provided in a standing state at the peripheral edge of the first surface of the reflective layer 13, light directed to the adjacent subpixel 100 can be reflected by the extended portion 31B. Therefore, the front luminance of display device 10 can be improved.

3 Modifications (Modification 1)

Figure 8:
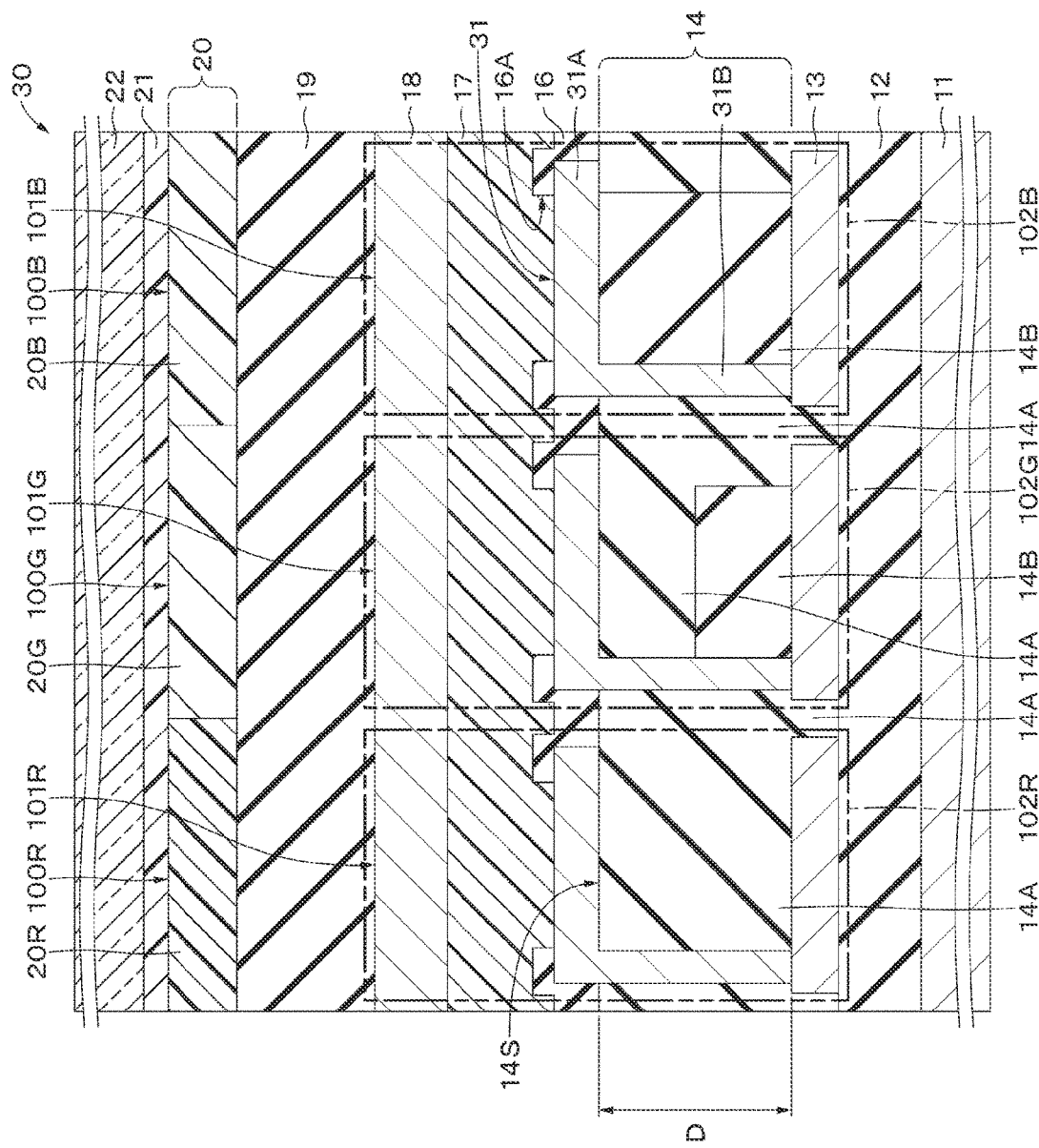
FIG. 8 is a cross-sectional view illustrating an example of a configuration of a display device according to a modification of the second embodiment of the present disclosure.
Figure 9:
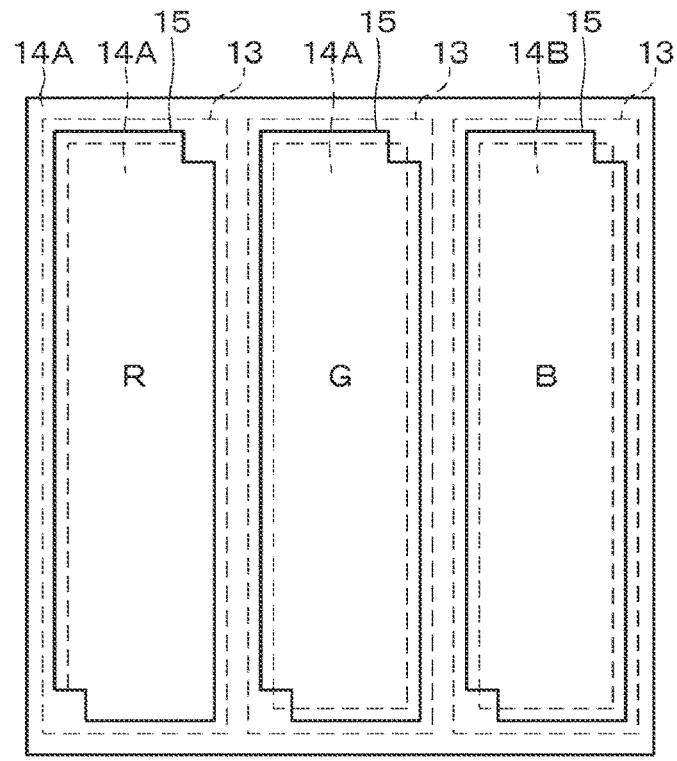
FIG. 9 is a plan view illustrating an example of a configuration of a reflective layer, an optical path length adjustment layer, and a first electrode.

In the second embodiment, the example has been described in which the extended portion 31B is extended from the entire peripheral edge of the second surface of the electrode body 31A toward the entire peripheral edge of the first surface of the reflective layer 13. However, as illustrated in FIGS. 8 and 9, the extended portion may be extended from a part of the peripheral edge of the second surface of the electrode body 31A toward a part of the peripheral edge of the first surface of the reflective layer 13. That is, the extended portion 31B may form a wall on a part of the peripheral edge of the first surface of the reflective layer 13.

(Modification 2)

In the first and second embodiments, the example in which the display devices 10, 30 include the subpixels 100 of three colors has been described. However, the display devices 10, 30 may include the subpixels 100 of a plurality of colors other than three colors.

(Modification 3)

The layer configuration of the optical path length adjustment layer 14 is not limited to the examples described in the first and second embodiments but may have a layer configuration other than those described in the first and second embodiments. For example, in the first and second embodiments, the example has been described in which the optical path length adjustment layer 14 includes two refractive index layers with different refractive indexes (i.e., the first refractive index layer 14A and the second refractive index layer 14B). However, the optical path length adjustment layer 14 may include three or more refractive index layers with different refractive indexes.

(Modification 4)

In the first embodiment, the example in which the first refractive index layer 14A contains a metal oxide has been described, but the first refractive index layer 14A may contain a polymer resin. The polymer resin includes, for example, at least one selected from the group consisting of a thermosetting resin, an ultraviolet curable resin, and the like.

As in the first embodiment, in a case where the first refractive index layer 14A is configured to cover each of the separated second refractive index layers 14B (cf. FIG. 2), it is particularly preferable that the first refractive index layer 14A contain a polymer resin. In a case where the first refractive index layer 14A contains a polymer resin, the first refractive index layer 14A can be formed by forming the second refractive index layer 14B on the reflective layer 13 and then applying a resin to the first surface of the insulating layer 12 and curing the resin in the manufacturing process of the display device 10. This can simplify the manufacturing process of the display device 10.

(Modification 5)

In the first and second embodiments, the example has been described in which the reflective layer 13 has the same thickness in the subpixels 100R, 100G, 100B of the three colors. However, the thickness of the reflective layer 13 may be different for each of the subpixels 100R, 100G, 100B of the three colors. In this case, the thickness D of the optical path length adjustment layer 14 between the reflective layer 13 and the first electrode 15 or between the reflective layer 13 and the electrode body 31A is adjusted for each of the subpixels 100R, 100G, 100B of the three colors so that the height of the facing surface 14S of the optical path length adjustment layer 14 is constant for each of the subpixels 100R, 100G, 100B of the three colors.

4 Application Examples (Electronic Equipment)

Figure 10:
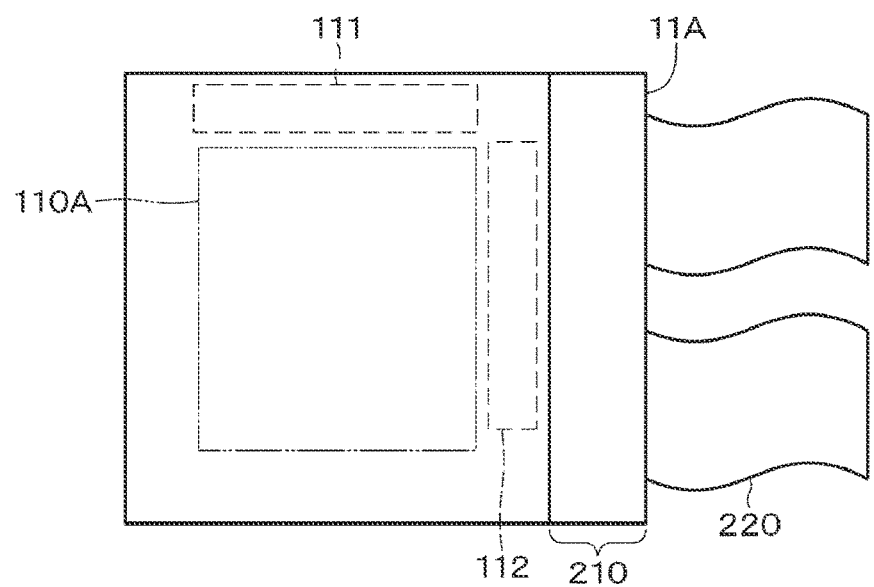
FIG. 10 is a plan view illustrating an example of a schematic configuration of a module.

The display devices 10, 30 (hereinafter referred to as "the display device 10 and the like") according to the first and second embodiments and the modifications thereof described above can be used for various electronic equipment. The display device 10 and the like are incorporated in various electronic equipment, for example, as a module as illustrated in FIG. 10. It is particularly suitable for use in an electronic viewfinder for a video camera or a single-lens reflex camera, a head-mounted display, or the like that requires high resolution and is magnified close to the eye. The module has an area 210 exposed without being covered with the facing substrate 22 or the like on one short side of the drive substrate 11, and external connection terminals (not illustrated) are formed in the area 210 by extending the wires of the signal line drive circuit 111 and the scanning line drive circuit 112. A flexible printed circuit (FPC) 220 for inputting and outputting signals may be connected to the external connection terminal.

Specific Example 1

Figure 11:
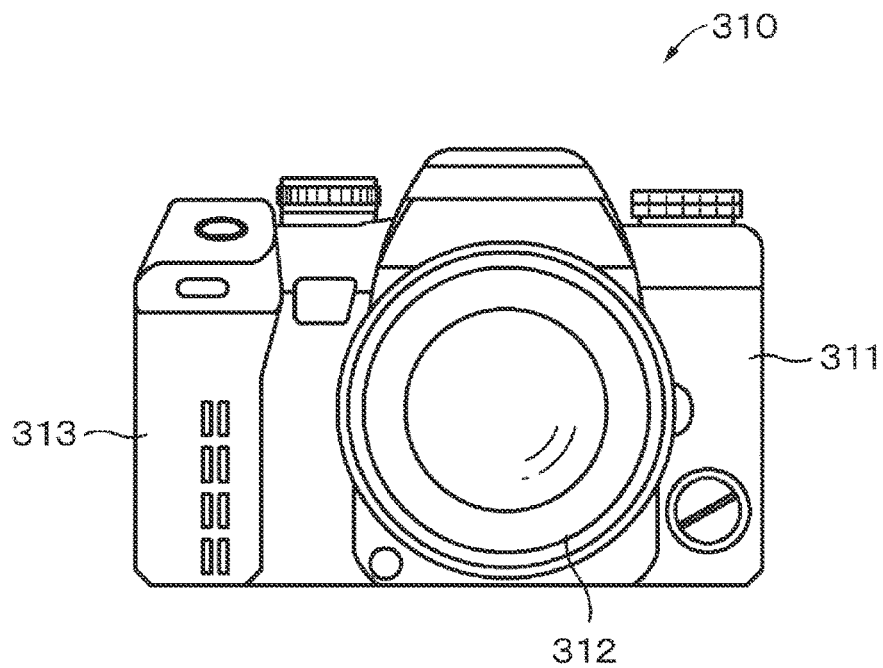
FIG. 11A is a front view illustrating an example of an appearance of a digital still camera.
FIG. 11B is a rear view illustrating an example of the appearance of the digital still camera.
Figure 11:
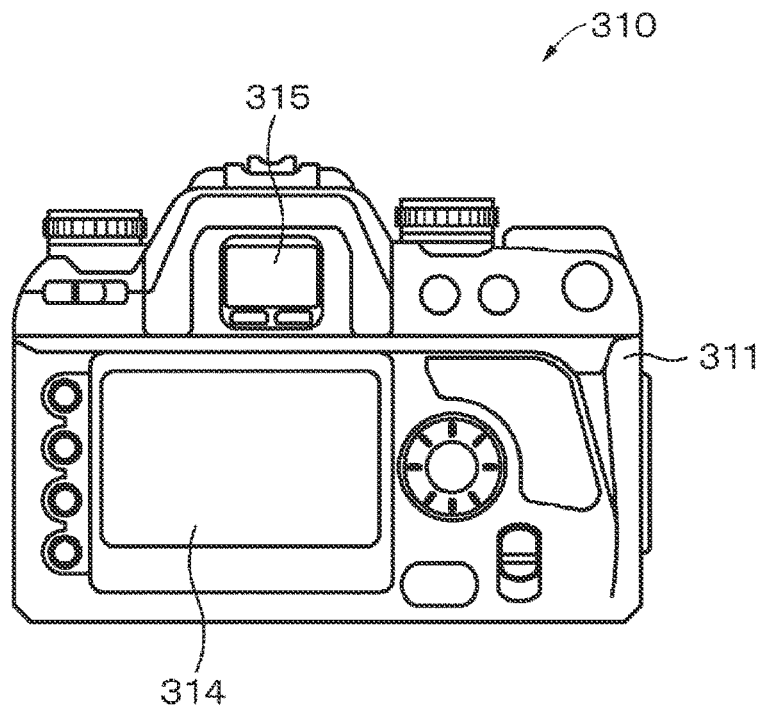

FIGS. 11A and 11B illustrate an example of an appearance of a digital still camera 310. The digital still camera 310 is of a lens-interchangeable single-lens reflex type and includes an interchangeable taking lens unit (interchangeable lens) 312 substantially at the center in front of a camera body 311, and a grip 313 to be held by a photographer on the front left side.

A monitor 314 is provided at a position off to the left from the center of the back surface of the camera body 311. An electronic viewfinder (eyepiece window) 315 is provided above the monitor 314. By looking into the electronic viewfinder 315, the photographer can view the optical image of the subject guided from the taking lens unit 312 to determine the composition. As the electronic viewfinder 315, the display device 10 and the like can be used.

Specific Example 2

Figure 12:
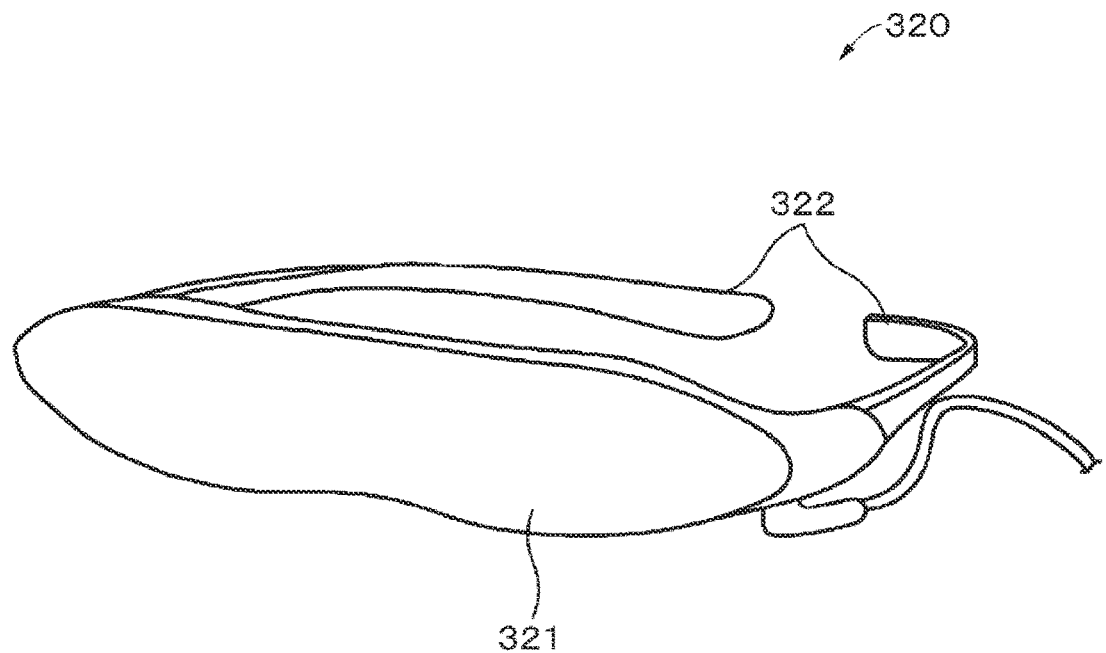
FIG. 12 is a perspective view of an example of an appearance of a head-mounted display.

FIG. 12 illustrates an example of an appearance of a head-mounted display 320. The head-mounted display 320 includes, for example, an ear hook 322 to be mounted on the head of a user on both sides of a glass-shaped display part 321. As the display part 321, the display device 10 and the like can be used.

Specific Example 3

Figure 13:
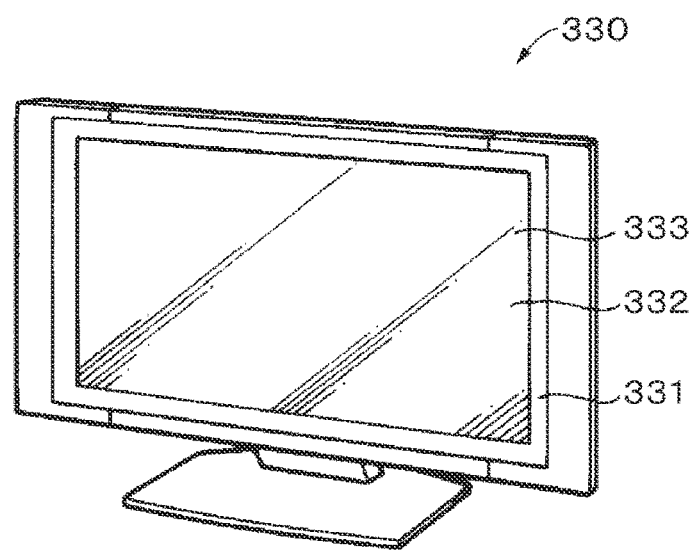
FIG. 13 is a perspective view illustrating an example of an appearance of a television apparatus.

FIG. 13 illustrates an example of an appearance of a television apparatus 330. The television apparatus 330 includes, for example, a video display screen part 331 including a front panel 332 and a filter glass 333, and the video display screen part 331 includes the display device 10 and the like.

Although the first and second embodiments and the modifications thereof according to the present disclosure have been specifically described above, the present disclosure is not limited to the first and second embodiments and the modifications thereof described above, and various modifications based on the technical idea of the present disclosure can be made.

For example, the configurations, methods, processes, shapes, materials, numerical values, and the like described in the first and second embodiments and the modifications thereof are merely examples, and different configurations, methods, processes, shapes, materials, numerical values, and the like may be used as necessary.

The configurations, methods, processes, shapes, materials, numerical values, and the like of the first and second embodiments and the modifications thereof can be combined with each other without departing from the gist of the present disclosure.

The materials exemplified in the first and second embodiments and the modifications thereof can be used alone or in a combination of two or more unless otherwise specified.

Further, the present disclosure can adopt the following configurations.

(1)

A display device including:
- a substrate; and
- subpixels of a plurality of colors arranged two-dimensionally on the substrate, in which
- each of the subpixels includes a light-emitting element with a resonator structure, and the light-emitting element includes a reflective layer, an optical path length adjustment layer, a first electrode, an electroluminescent layer, and a second electrode in this order,
- the optical path length adjustment layer has a facing surface facing the electroluminescent layer, and a height of the facing surface is constant for each of the subpixels of the plurality of colors,
- the optical path length adjustment layer includes a plurality of refractive index layers with different refractive indexes, and
- the optical path length adjustment layer has a different layer configuration for each of the subpixels of the plurality of colors.

(2)

The display device according to (1), in which a thickness of the optical path length adjustment layer between the reflective layer and the first electrode is constant for each of the subpixels of the plurality of colors.

(3)

The display device according to (1) or (2), in which a distance between the reflective layer and the second electrode is constant for each of the subpixels of the plurality of colors.

(4)

The display device according to any one of (1) to (3), in which the layer configuration of each of the subpixels of the plurality of colors is set so that light corresponding to a color of each of the subpixels is resonated in the resonator structure.

(5)

The display device according to any one of (1) to (4), in which
- the optical path length adjustment layer includes a first refractive index layer and a second refractive index layer with a refractive index higher than a refractive index of the first refractive index layer, and
- a layer configuration of the optical path length adjustment layer in at least a subpixel of one color among the subpixels of the plurality of colors is a lamination configuration of the first refractive index layer and the second refractive index layer.

(6)

The display device according to (5), in which
- the first refractive index layer is continuously provided over the subpixels of the plurality of colors, and
- the second refractive index layer is separated and provided in subpixels of some colors among the subpixels of the plurality of colors.

(7)

The display device according to (6), in which a side surface of each of the separated second refractive index layers is covered with the first refractive index layer.

(8)

The display device according to (5), in which the second refractive index layer is separated and provided in subpixels of some colors among the subpixels of the plurality of colors, and the first refractive index layer covers each of the separated second refractive index layers.

(9)

The display device according to (8), in which the first refractive index layer contains a resin.

(10)

The display device according to any one of (1) to (4), in which
- the subpixels of the plurality of colors include a subpixel of a first color, a subpixel of a second color, and a subpixel of a third color, and
- the optical path length adjustment layer includes a first refractive index layer and a second refractive index layer with a refractive index higher than a refractive index of the first refractive index layer.

(11)

The display device according to (10), in which the resonator structure of the subpixel of the first color, the resonator structure of the subpixel of the second color, and the resonator structure of the subpixel of the third color resonate light of the first color, light of the second color light, and light of the third color, respectively.

(12)

The display device according to (10) or (11), in which
- a layer configuration of the optical path length adjustment layer in the subpixel of the first color is a monolayer configuration of the first refractive index layer,
- a layer configuration of the optical path length adjustment layer in the subpixel of the second color is a lamination configuration of the first refractive index layer and the second refractive index layer, and
- a layer configuration of the optical path length adjustment layer in the subpixel of the third color is a monolayer configuration of the second refractive index layer.

(13)

The display device according to (10) or (11), in which
- a layer configuration of the optical path length adjustment layer in the subpixel of the first color is a monolayer configuration of the first refractive index layer,
- a layer configuration of the optical path length adjustment layer in each of the subpixel of the second color and the subpixel of the third color is a lamination configuration of the first refractive index layer and the second refractive index layer, and
- thicknesses of the first refractive index layer and the second refractive index layer are different between the subpixel of the second color and the subpixel of the third color.

(14)

The display device according to any one of (10) to (13), in which the first color, the second color, and the third color are red, green, and blue, respectively.

(15)

The display device according to any one of (1) to (14), in which the first electrode includes an electrode body and an extended portion, and the extended portion is extended from a peripheral edge of the electrode body toward the reflective layer and is connected to the reflective layer.

(16)

Electronic equipment including the display device according to any one of (1) to (15).

REFERENCE SIGNS LIST 10, 30 Display device
11 Drive substrate
12 Interlayer insulating film
13 Reflective layer
14 Optical path length adjustment layer
14A First refractive index layer
14B Second refractive index layer
14C Contact plug
14D, 14E, 14F Metal oxide layer
15, 31 first electrode
16 Inter-element insulating layer
17 Organic electroluminescent layer
18 Second electrode
19 Protective layer
20 Color filter
20R Red filter
20G Green filter
20B Blue filter
21 Filling resin layer
22 Facing substrate
23, 24 Resist layer
31 Electrode body
32 Extended portion
100R, 100G, 100B Subpixel
101R, 101G, 101B Light-emitting element
102R, 102G, 102B Resonator structure
110A Display area
110B Peripheral area
111 Signal line drive circuit
111A Signal line
112 Scanning line drive circuit
112A Scanning line
310 Digital still camera (electronic equipment)
320 head-mounted display (electronic equipment)
330 Television apparatus (electronic equipment)

The invention claimed is:

1. A display device comprising:
a substrate; and
subpixels of a plurality of colors arranged two-dimensionally on the substrate, the subpixels including a first subpixel of a first color, a second subpixel of a second color and a third subpixel of a third color, wherein
each of the subpixels includes a light-emitting element with a resonator structure, and the light-emitting element includes a reflective layer, an optical path length adjustment layer, a first electrode, an electroluminescent layer, and a second electrode in this order,
the optical path length adjustment layer has an upper surface facing the electroluminescent layer, a level of the upper surface of the optical path length adjustment layer being a same level for each of the subpixels of the plurality of colors in a cross-sectional view,
the optical path length adjustment layer includes a plurality of refractive index layers with different refractive indexes, the plurality of refractive index layers including a first refractive index layer and a second refractive index layer, the first refractive index layer being arranged for each of the first subpixel, the second subpixel and the third subpixel, the second refractive index layer including a first portion corresponding to the second subpixel and a second portion corresponding to the third subpixel, the first portion having a different thickness than the second portion in the cross-sectional view,
the first refractive index layer includes a portion arranged between an upper surface of the first portion of the second refractive index layer and the first electrode for the second subpixel in the cross-sectional view,
the first refractive index layer includes a portion arranged between an upper surface of the second portion of the second refractive index layer and the first electrode for the third subpixel in the cross-sectional view, and
the optical path length adjustment layer has a different layer configuration for each of the subpixels of the plurality of colors.

2. The display device according to claim 1, wherein a distance between the reflective layer and the second electrode is constant for each of the subpixels of the plurality of colors.

3. The display device according to claim 1, wherein a layer configuration of each of the subpixels of the plurality of colors is set so that light corresponding to a color of each of the subpixels is resonated in the resonator structure.

4. The display device according to claim 1, wherein the first refractive index layer contains a resin.

5. The display device according to claim 1, wherein the resonator structure of the first subpixel of the first color, the resonator structure of the second subpixel of the second color, and the resonator structure of the third subpixel of the third color are configured to resonate light of the first color, light of the second color, and light of the third color, respectively.

6. The display device according to claim 1, wherein the first color, the second color, and the third color are red, green, and blue, respectively.

7. The display device according to claim 1, wherein the first electrode includes an electrode body and an extended portion, and the extended portion is extended from a peripheral edge of the electrode body toward the reflective layer and is connected to the reflective layer.

8. Electronic equipment comprising the display device according to claim 1.

9. The electronic equipment according to claim 8, wherein a distance between the reflective layer and the second electrode is constant for each of the subpixels of the plurality of colors.

10. The electronic equipment according to claim 8, wherein a layer configuration of each of the subpixels of the plurality of colors is set so that light corresponding to a color of each of the subpixels is resonated in the resonator structure.

11. A display device comprising:
a substrate; and
subpixels of a plurality of colors arranged two-dimensionally on the substrate, the subpixels including a first subpixel of a first color, a second subpixel of a second color and a third subpixel of a third color, wherein each of the subpixels includes a light-emitting element with a resonator structure, and the light-emitting element includes a reflective layer, an optical path length adjustment layer, a first electrode, an electroluminescent layer, and a second electrode in this order, the optical path length adjustment layer has an upper surface facing the electroluminescent layer, a level of the upper surface of the optical path length adjustment layer being a same level for each of the subpixels of the plurality of colors in a cross-sectional view, the optical path length adjustment layer includes a plurality of refractive index layers with different refractive indexes, the optical path length adjustment layer has a different layer configuration for each of the subpixels of the plurality of colors, and a thickness of the optical path length adjustment layer between the reflective layer and the first electrode is a same thickness for the first subpixel of the first color, the second subpixel of the second color and the third subpixel of the third color.

12. Electronic equipment comprising the display device according to claim 11.

13. A display device comprising:
a substrate; and
subpixels of a plurality of colors arranged two-dimensionally on the substrate, wherein
each of the subpixels includes a light-emitting element with a resonator structure, and the light-emitting element includes a reflective layer, an optical path length adjustment layer, a first electrode, an electroluminescent layer, and a second electrode in this order, the optical path length adjustment layer has an upper surface facing the electroluminescent layer, a level of the upper surface of the optical path length adjustment layer being a same level for each of the subpixels of the plurality of colors in a cross-sectional view, the optical path length adjustment layer includes a plurality of refractive index layers with different refractive indexes, the optical path length adjustment layer has a different layer configuration for each of the subpixels of the plurality of colors, the subpixels of the plurality of colors include a subpixel of a first color, a subpixel of a second color, and a subpixel of a third color, the optical path length adjustment layer includes a first refractive index layer and a second refractive index layer with a refractive index higher than a refractive index of the first refractive index layer, a layer configuration of the optical path length adjustment layer in the subpixel of the first color is a monolayer configuration of the first refractive index layer, a layer configuration of the optical path length adjustment layer in the subpixel of the second color is a lamination configuration of the first refractive index layer and the second refractive index layer, and a layer configuration of the optical path length adjustment layer in the subpixel of the third color is a monolayer configuration of the second refractive index layer.

14. Electronic equipment comprising the display device according to claim 13.

15. A display device comprising:
a substrate; and
subpixels of a plurality of colors arranged two-dimensionally on the substrate, wherein
each of the subpixels includes a light-emitting element with a resonator structure, and the light-emitting element includes a reflective layer, an optical path length adjustment layer, a first electrode, an electroluminescent layer, and a second electrode in this order, the optical path length adjustment layer has an upper surface facing the electroluminescent layer, a level of the upper surface of the optical path length adjustment layer being a same level for each of the subpixels of the plurality of colors in a cross-sectional view, the optical path length adjustment layer includes a plurality of refractive index layers with different refractive indexes, the optical path length adjustment layer has a different layer configuration for each of the subpixels of the plurality of colors, the subpixels of the plurality of colors include a subpixel of a first color, a subpixel of a second color, and a subpixel of a third color, the optical path length adjustment layer includes a first refractive index layer and a second refractive index layer with a refractive index higher than a refractive index of the first refractive index layer, a layer configuration of the optical path length adjustment layer in the subpixel of the first color is a monolayer configuration of the first refractive index layer, a layer configuration of the optical path length adjustment layer in each of the subpixel of the second color and the subpixel of the third color is a lamination configuration of the first refractive index layer and the second refractive index layer, and thicknesses of the first refractive index layer and the second refractive index layer are different between the subpixel of the second color and the subpixel of the third color.

16. Electronic equipment comprising the display device according to claim 15.

* * * * *